United States Patent
Sakurai et al.

(10) Patent No.: US 6,293,003 B1
(45) Date of Patent: Sep. 25, 2001

(54) ELECTRONIC PART MOUNTING DEVICE

(75) Inventors: Kunio Sakurai, Sakai; Wataru Hirai; Minoru Yamamoto, both of Osaka; Seiichi Mogi, Neyagawa, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/000,467

(22) PCT Filed: Jul. 23, 1996

(86) PCT No.: PCT/JP96/02052

§ 371 Date: Jan. 23, 1998

§ 102(e) Date: Jan. 23, 1998

(87) PCT Pub. No.: WO97/04633

PCT Pub. Date: Feb. 6, 1997

(30) Foreign Application Priority Data

Jul. 24, 1995 (JP) .................................................. 7-186794

(51) Int. Cl.⁷ ...................................................... B23P 19/00
(52) U.S. Cl. ................................... 29/740; 29/743; 72/94; 74/569; 74/55
(58) Field of Search ........................... 29/740, 742, 743; 72/94, 210, 452.6; 74/569, 55

(56) References Cited

U.S. PATENT DOCUMENTS

| | | | |
|---|---|---|---|
| 5,184,397 | * 2/1993 | Hidese | 29/740 |
| 5,331,731 | * 7/1994 | Suzuki et al. | 29/759 |
| 5,339,248 | * 8/1994 | Fujiwara et al. | 364/468 |
| 5,544,411 | * 8/1996 | Kano et al. | 29/740 |
| 5,588,195 | * 12/1996 | Asai et al. | 29/33 M |
| 5,676,006 | * 10/1997 | Marshall | 72/94 |

FOREIGN PATENT DOCUMENTS

| | | |
|---|---|---|
| 63-174397 | 7/1988 | (JP) . |
| 3-8398 | * 1/1991 | (JP) . |
| 4-345097 | 12/1992 | (JP) . |
| 5-29795 | 2/1993 | (JP) . |

* cited by examiner

Primary Examiner—Lee Young
Assistant Examiner—A. Dexter Tugbang
(74) Attorney, Agent, or Firm—Wenderoth, Lind & Ponack, L.L.P.

(57) ABSTRACT

An electronic component mounting apparatus includes a plurality of pickup nozzles (1) which are attached to the periphery of a rotary table, that intermittently rotates. The apparatus also includes a cylindrical cam (105) having a cam groove (106, 107a, 107b) which allows the pickup nozzles (1) to move up and down. A first roller (5) is attached to a first slide portion (4a), which is equipped with the pickup nozzles 1. The first roller runs within the cam grooves (106, 107a, 107b) to make the pickup nozzles 1 move up and down. A second roller (6) is attached to a second slide portion 4b, which is attached to the pickup nozzles (1). The second roller runs within the cam grooves (106, 107a, 107b) to make the pickup nozzles move up and down together with the first roller. Also, springs (9) are provided for biasing the first and second rollers (5, 6) into contact with the two side surfaces, respectively, of the cam grooves (106, 107a, 107b).

14 Claims, 8 Drawing Sheets

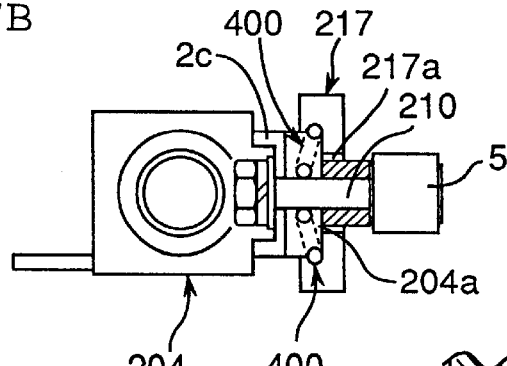
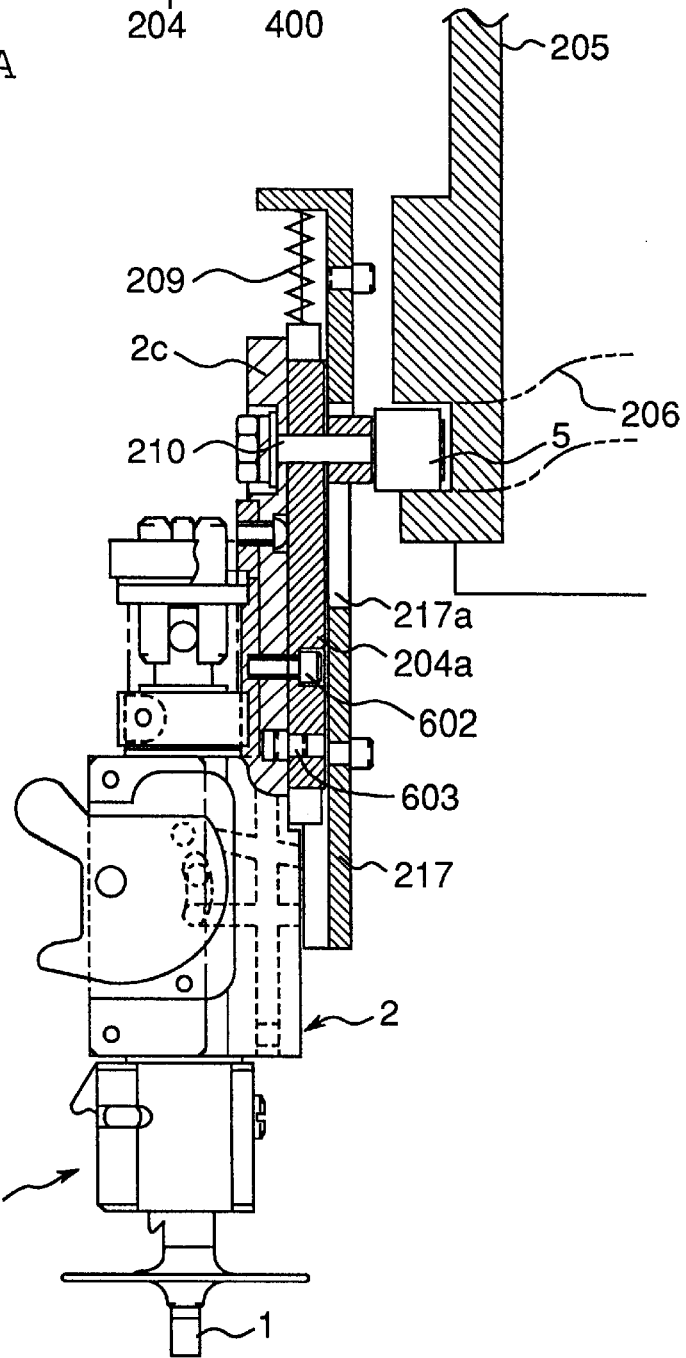

ELECTRONIC PART MOUNTING DEVICE

BACKGROUND OF THE INVENTION

1. Technical Field

The present invention relates to an electronic component mounting apparatus for mounting electronic components onto a circuit board and, more particularly, to an electronic component mounting apparatus in which a pickup nozzle (suction nozzle) is moved up and down by using a cylindrical cam.

2. Description of Related Art

As a prior art example of the electronic component mounting apparatus in which a pickup (suction) nozzle unit is moved up and down by using a cylindrical cam, one as described in Unexamined Japanese Patent Publication No. 3-8398, which is provided with a cylindrical cam having a fixed-portion and up/down-movable-portion composite cam groove over the entire circumference, is described with reference to FIGS. 8 to 12. It is noted that some cylindrical cams have only fixed cam grooves. In such a case, in the following description of the prior art, the fixed-portion and up/down-movable-portion composite cam groove is replaced by a fixed cam groove, where the fixed cam groove moves a pickup nozzle unit to a specified working position, so that the pickup nozzle unit is positioned at the specified working position, and thereafter a pickup nozzle of the pickup nozzle unit is moved up and down by a rotating cam and a lever mechanism.

Referring to FIG. 8, on a support base 116 are fixed an index unit 101, a cylindrical cam 105, plate cams 109a, 109b, levers 108a, 108b which are actuated by the plate cams 109a, 109b, and springs 110a, 110b which bias the levers 108a, 108b into press contact with the plate cams 109a, 109b, respectively.

The index unit 101 drives a rotating shaft 102 into intermittent rotational motion. A rotary table 103 is attached to a lower end of the rotating shaft 102. Up/down guides 117 which guide the up and down sliding movement of a plurality of pickup nozzle units 104 are fixed at equal intervals on the periphery of the rotary table 103.

Each of the plurality of pickup nozzle units 104 comprises: a block 111 which is inserted in the up/down guide 117 so as to slide up and down; a pickup nozzle 113 inserted in the block 111 in the up/down direction and biased upward toward the block 111 by a spring 118; and a cam follower 112 placed in a fixed-portion cam groove 106 and up/down-movable-portion cam grooves 107a, 107b which are provided in an up-and-down wavy shape over the entire circumference of the cylindrical cam 105 fixed to the support base 116. The cam follower 112 is a roller as shown in FIG. 12.

Next, detailed structure of the fixed-portion cam groove 106 and the up/down-movable-portion cam grooves 107a, 107b of the cylindrical cam 105 as well as operation of the cam follower 112 are described with reference to FIGS. 8 to 11.

Referring to FIGS. 8 to 11, the cylindrical cam 105 is fixed to outside of the rotating shaft 102 in a coaxial state with the rotating shaft 102 that performs intermittent rotational motion, as shown in FIGS. 8 and 9.

In the cylindrical cam 105, as shown in FIGS. 9 to 11, the fixed-portion cam groove 106 as well as the up/down-movable-portion cam grooves 107a, 107b which intervene partly across the fixed-portion cam groove 106 are provided in an up-and-down wavy state over the entire circumference of the cylindrical cam 105. The up/down-movable-portion cam grooves 107a, 107b are provided at specified positions on the circumference of the cylindrical cam 105, i.e., at the locations of a component pickup station and a component mounting station where the pickup nozzle units 104 work. In FIG. 8, the up/down-movable-portion cam groove 107a is positioned at the location of the component mounting station where an electronic component is mounted onto a circuit board 115, while the up/down-movable-portion cam groove 107b is positioned at the location of the component pickup station where a component is picked up from a component feed unit 114.

Then, as shown in FIG. 8, upper ends of the up/down-movable-portion cam grooves 107a, 107b are connected to the levers 108a, 108b, respectively, and the up/down-movable-portion cam grooves 107a, 107b will be slid up and down by the levers 108a, 108b which are actuated up and down by the rotation of the plate cams 109a, 109b, respectively.

Within the fixed-portion cam groove 106 and the up/down-movable-portion cam grooves 107a, 107b, as shown in FIGS. 8 to 11, is placed the cam follower 112. The cam follower 112 is integrally combined with the block 111 that is inserted in the up/down guide 117 so as to slide up and down as described above. Therefore, when the rotation of the rotary table 103 causes the block 111 to go into intermittent rotational motion around the cylindrical cam 105, the cam follower 112 moves up and down along the fixed-portion cam groove 106 and the up/down-movable-portion cam grooves 107a, 107b while rotating.

In this case, the plate cams 109a, 109b will rotate in synchronization with the intermittent rotational motion of the rotating shaft 102 and the rotary table 103 driven by the index unit 101. However, the plate cams 109a, 109b have such a shape that the levers 108a, 108b will not be actuated during time durations when the cam follower 112 is within the fixed-portion cam groove 106 of the cylindrical cam 105, and as shown in FIG. 11, the up/down-movable-portion cam grooves 107a, 107b will not be moved down until the cam follower 112 reaches the up/down-movable-portion cam grooves 107a, 107b of the cylindrical cam 105. As the up/down-movable-portion cam grooves 107a, 107b move down, the cam follower 112 moves as shown by a cam follower track 119 indicated by two-dot chain line in FIG. 11. While the rotating shaft 102 and the rotary table 103 are at an intermittent rest, the cam follower 112 reaches a lowermost position 119a as shown by the cam follower track 119, at which lowermost position 119a the pickup nozzle 113 is made to perform an electronic component pickup operation or mounting operation. With this operation completed, as the rotating shaft 102 and the rotary table 103 start rotating, the plate cams 109a, 109b make the up/down-movable-portion cam grooves 107a, 107b move upward again, thereby rising them until the up/down-movable-portion cam grooves 107a, 107b coincide with the fixed-portion cam groove 106 of the cylindrical cam 105.

With the above constitution, the operation time of component mounting operation can be reduced in the following way.

By the drive of the index unit 101, the rotating shaft 102 and the rotary table 103 are caused to go into intermittent rotational motion, and the plurality of pickup nozzle units 104 attached to the periphery of the rotary table 103 are caused to start rotating. While the cam follower 112 is within the fixed-portion cam groove 106 of the cylindrical cam 105, the plate cams 109a, 109b are equal in the diameter of operative portion to each other so that the levers 108a, 108b will not be actuated. However, as shown in FIG. 11, when the cam follower 112 has reached the portions of the cylindrical cam 105 corresponding to the up/down-movable-portion cam grooves 107a, 107b, the plate cams 109a, 109b have operative portions in troughs so that the levers 108a, 108b will be actuated, and the up/down-movable-portion cam grooves 107a, 107b will be lowered. During the rest time of the intermittent rotational motion of the index unit 101, the up/down-movable-portion cam grooves 107a, 107b reach the lowermost position 119a, causing the pickup nozzle 113 to perform the electronic-component pickup or mounting operation. With this operation completed, as the rotating shaft 102 and the rotary table 103 start rotating, the up/down-movable-portion cam grooves 107a, 107b move upward again, rising until the up/down-movable-portion cam grooves 107a, 107b coincide with the fixed-portion cam groove 106.

In comparison with the olc type in which the up/down-movable-portion cam grooves 107a, 107b are not provided and the plate cams 109a, 109b will not start operating, neither will the pickup nozzle of the pickup nozzle unit start lowering, before the pickup nozzle unit reaches the location of the next working station, the above-described prior art example accomplishes a reduction in the cycle time of the pickup nozzle by virtue of the arrangement that the pickup nozzle 113 starts its lowering operation midway of the move from one working position to the next working position, so that the pickup nozzle 113 has substantially completed the lowering operation at the time point when it reaches the next working position, in the aforementioned manner.

However, with the construction of the prior art example of the electronic component mounting apparatus in which the pickup-nozzle unit is moved up and down by using the cylindrical cam, both old and new types described above, as shown in FIG. 12, would be required to make the diameter of the roller of the cam follower 112 smaller than the groove widths of the cam grooves 106, 107a, 107b (FIG. 12 shows the cam groove 106 representatively), such that there would necessarily exist a gap G between the roller of the cam follower 112 and each of the cam groove surfaces of the cam grooves 106, 107a, 107b. Accordingly, each time the cam follower 112 changes in the moving direction between up and down, the roller of the cam follower 112 would collide with the cam groove, for example, cam groove surfaces c, e of the cam groove 106 in FIG. 12. Upon this collision, vibrations caused by the collision would transfer from the cam follower 112 to the pickup nozzle 113, thereby causing a shift in the mounting position of the electronic component picked up by the pickup nozzle 113.

Also, because the contacting cam groove surfaces c, e will be changed over between upward movement and downward movement of the roller of the cam follower 112, rotational directions d, f of the roller, which is a rotating member of the cam follower 112, will be changed over upon each changeover of the cam groove surfaces c, e. A change in the rotational directions d, f of the roller of the cam follower 112 would adversely affect the service life of the cam follower 112 such that, particularly when the apparatus is driven at high speed, its service life would be shortened as an issue.

SUMMARY OF THE INVENTION

An object of the present invention is therefore to provide an electronic component mounting apparatus which produces less vibration and is long in service life.

In order to achieve the above object, the electronic component mounting apparatus according to a first aspect of the present invention comprises:

a rotary table which is intermittently driven into rotation;

a plurality of pickup nozzles which are attached movable up and down on periphery of the rotary table;

a cylindrical cam which is provided inside the rotary table and coaxial with the rotary table and which has, over its entire circumference, a cam groove for allowing the pickup nozzles to move up and down with intermittent rotation of the rotary table;

a first roller which is attached to the pickup nozzle and which runs within the cam groove to make the pickup nozzles move up and down; and a first spring for biasing the first roller into press contact with one side surface of the cam groove.

According to a second aspect of the present invention, in the first aspect, the apparatus may further comprise:

a second roller which is attached to the pickup nozzle and which runs within the cam groove to make the pickup nozzles move up and down together with the first roller; and a second spring for biasing the second roller into press contact with a side surface of the cam groove.

According to a third aspect of the present invention, in the second aspect, it is also possible that at least either one of the first roller or the second roller is attached to the pickup nozzle so as to be movable in a biasing direction of the spring.

According to a fourth aspect of the present invention, in any one of the first to third aspects, the cam groove may comprise one groove.

According to a fifth aspect of the present invention, in the second or third aspect, it is also possible that the cam groove is provided as two grooves comprising a first cam groove and a second cam groove, and that the first roller is pressed against one side surface of the first cam groove by the first spring while the second roller is pressed against one side surface of the second cam groove by the second spring.

In a sixth aspect of the present invention, in any one of the first to fifth aspects, it is also possible that a center line of lines of force of the spring is substantially coincident with a contact point of the roller and the cam groove.

In the electronic component mounting apparatus according to the above aspects of the invention, because the cam follower comprises the first roller which is attached to the pickup nozzle and which runs within the cam groove, and the spring for biasing the first roller into press contact with the one side surface of the cam groove, the first roller runs while being normally pressed against the one side surface of the cam groove. Therefore, it becomes possible to solve the issue that the roller of the cam follower would collide with the side surface of the cam groove upon each changeover of the up-and-down moving direction of the cam follower, causing vibrations, as would inevitably be involved in the prior art example having a gap between the roller of the cam follower and the side surface of the cam groove. As a result, the precision at which the electronic component is mounted onto the circuit board can be improved. Further, because the first roller will contact with an unchanged side surface of the cam groove, thus rotating constantly in one direction, the roller is prolonged in service life while higher-speed operation is facilitated.

In the electronic component mounting apparatus according to the above aspects of the invention, provided that the cam follower further comprises the second roller which is attached to the pickup nozzle and which runs within the cam groove, and the spring for biasing the second roller into press contact with the other side surface of the cam groove, then the first roller is normally pressed against the one side surface of the cam groove as described above and moreover the second roller runs while being normally pressed against the other side surface of the cam groove. Therefore, it becomes possible to solve the issue that the roller of the cam follower would collide with the side surface of the cam groove upon each changeover of the up-and-down moving direction of the cam follower, causing vibrations, as would inevitably be involved in the prior art example having a gap between the roller of the cam follower and the side surface of the cam groove. As a result, the precision at which the electronic component is mounted onto the circuit board can be improved. Further, because both the first roller and the second roller will contact with unchanged side surfaces of the cam groove, respectively, thus each rotating constantly in one direction, the rollers are prolonged in service life while higher-speed operation is facilitated.

BRIEF DESCRIPTION OF THE DRAWINGS

These and other objects and features of the present invention will become apparent from the following description taken in conjunction with preferred embodiments thereof with reference to the accompanying drawings, in which:

FIGS. 7A and 7B are a partial side view in cross section and a plan view, respectively, showing part of an electronic component mounting apparatus according to a third embodiment of the present invention;

DETAILED DESCRIPTION OF THE INVENTION

Figure 1:
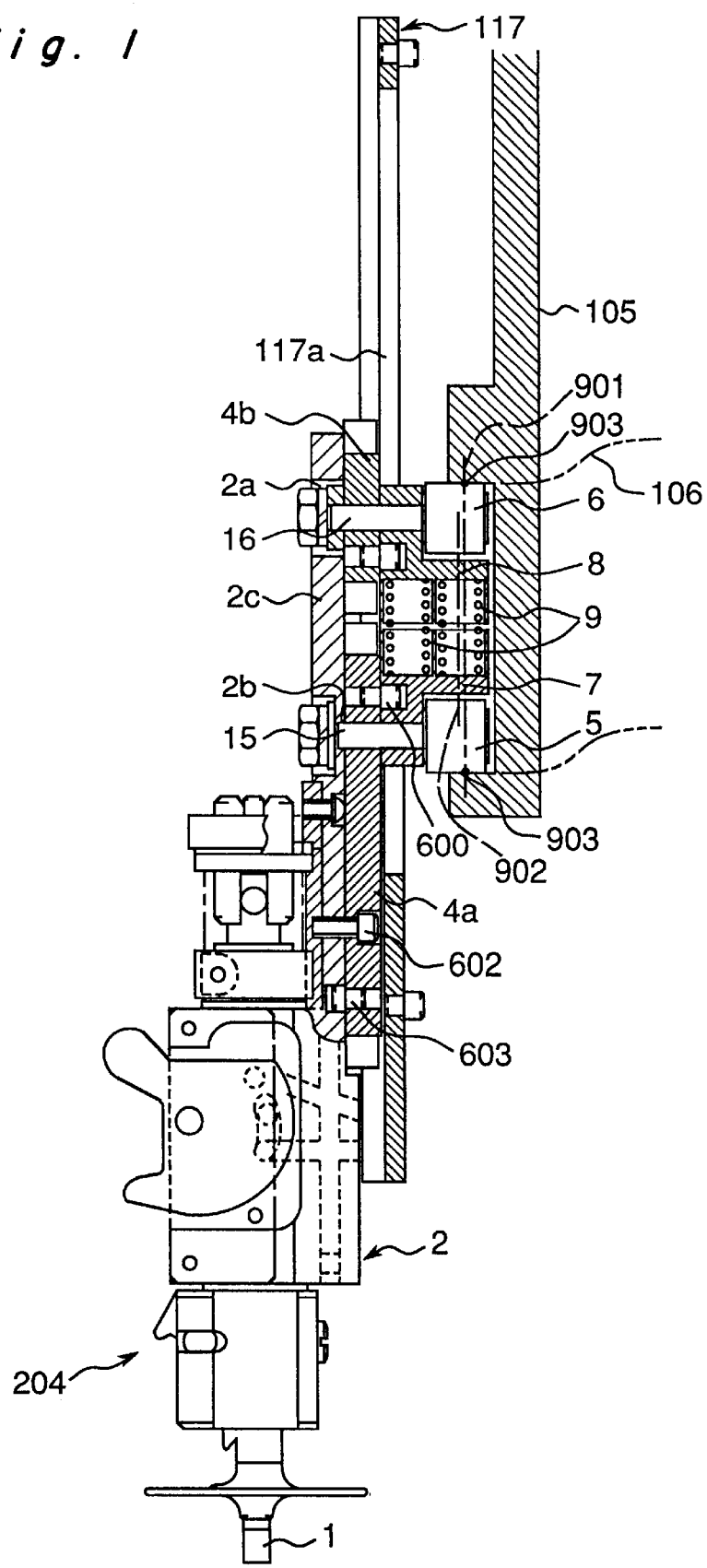
FIG. 1 is a partial side view in cross section showing part of an electronic component mounting apparatus according to a first embodiment of the present invention.
Figure 2:
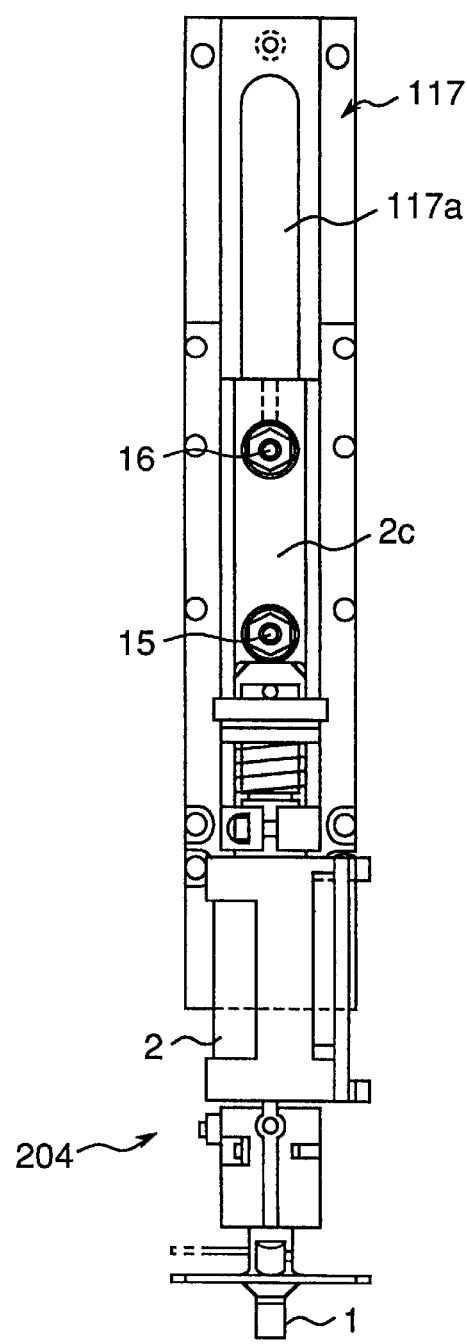
FIG. 2 is a front view showing part of the first embodiment.
Figure 3:
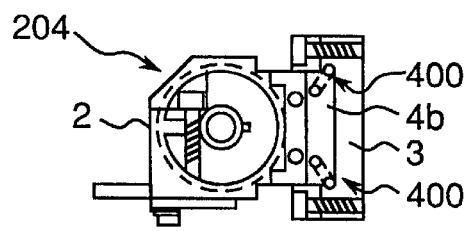
FIG. 3 is a plan view showing part of the first embodiment.
Figure 4A:
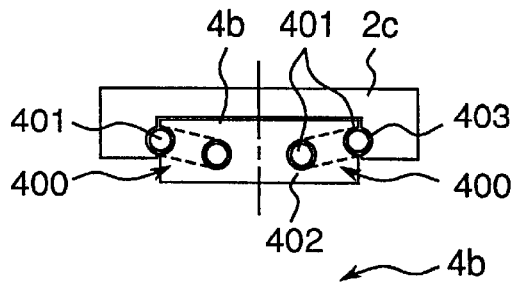
FIGS. 4A and 4B are a plan view and a side view, respectively, showing part of the first embodiment.
Figure 4B:
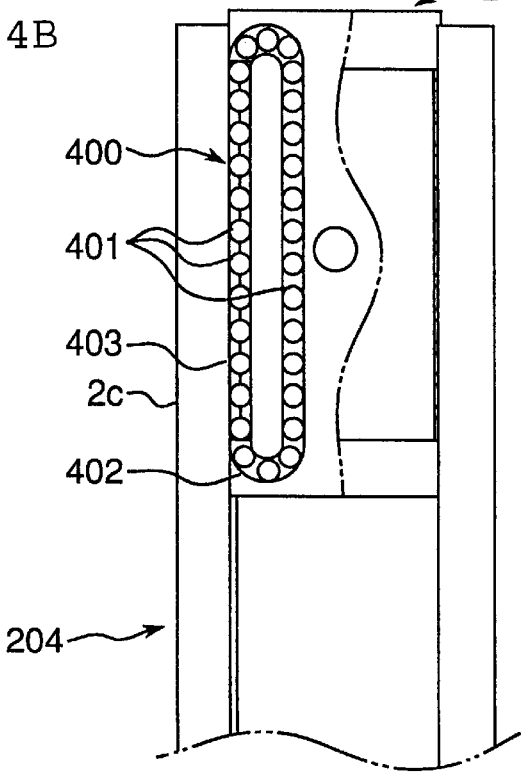

Before the description of the present invention proceeds, it is to be noted that like parts are designated by like reference numerals throughout the accompanying drawings.

An electronic component mounting apparatus according to a first embodiment of the invention will now be described with reference to FIGS. 1 to 5.

Figure 12:
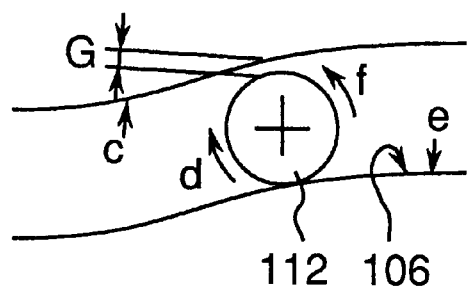
FIG. 12 is a schematic diagram showing main part of a prior art electronic component mounting apparatus having a cylindrical cam.

The difference between the electronic component mounting apparatus according to the first embodiment and the electronic component mounting apparatus according to the prior art lies in the cam follower portion. Whereas the cam follower of the prior art example comprises one roller 112 as shown in FIG. 12, the cam follower of the electronic component mounting apparatus according to the first embodiment comprises two rollers 5, 6 as shown in FIGS. 1 to 5. More specifically, the cam follower comprises: a first roller 5 which is fixed to a first block 4a of a pickup nozzle unit 204 and which runs within a cam groove 106; a second roller 6 which is supported by the pickup nozzle unit so as to be slightly movable upward and downward and which runs within the cam groove 106; and a compression spring 9 for biasing the first roller 5 and the second roller 6 into press contact with upper and lower side surfaces of the cam groove 106. The rest of the electronic component mounting apparatus is the same as the one described in the prior art example in which the pickup nozzle unit 204 (corresponding to the pickup nozzle unit 104 in the prior art example) is moved up and down by using the cylindrical cam 105, and so its description is omitted.

Referring to FIGS. 1 to 5, which show the pickup nozzle unit 204 of the electronic component mounting apparatus according to the first embodiment, reference numeral 1 denotes a pickup nozzle and reference numeral 2 denotes a nozzle housing, where the nozzle housing 2 comprises the pickup nozzle 1, and a first slide portion 4a and a second slide portion 4b both of which are inserted in a guide groove 117a of an up/down guide 117 attached to the periphery of the rotary table 103 as described in the prior art example to slide the pickup nozzle unit 204 up and down, and both of which are slidable up and down. A support shaft 15 that supports the first roller 5 rotatable is notably fixed to the first slide portion 4a and guided by the fixed-portion cam groove 106 and the up/down-movable-portion cam grooves 107a, 107b as described in the prior art example. The support shaft 15 is in contact with one side surface, for example the lower side surface in FIGS. 1 and 5, of each of the cam grooves 106, 107a, 107b. The first slide portion 4a is fixed to a support plate 2c of the pickup nozzle unit 204 by bolts 602, 603, and the first slide portion 4a will move up and down against the up/down guide 117 integrally with the pickup nozzle unit 2c. On the other hand, the second slide portion 4b is enabled by a pair of ball guides 400 to smoothly move up and down against the support plate 2c as shown in FIGS. 4A and 4B. Each ball guide 400 is arranged so that a multiplicity of balls 401 are rotatably accommodated between a groove 403 of the support plate 2c of the pickup nozzle housing 2 and a groove 402 of the second slide portion 4b. Accordingly, the second slide portion 4b will be moved up and down reliably and smoothly by the biasing force of the spring 9, as described later, while being guided by the ball guides 400.

The nozzle housing 2 has the second slide portion 4b up-and-down slidably attached to the guide groove 117a of the up/down guide 117, and the second roller 6 is fixed to the second slide portion 4b. The second roller 6 is guided by the fixed-portion cam groove 106 and the up/down-movable-portion cam grooves 107a, 107b as described in the prior art example. The second roller 6 is in contact with one side surface opposite to the side surface with which the first roller 5 is in contact, for example the upper side surface in FIGS. 1 and 5, of each of the cam grooves 106, 107a, 107b.

A spring holder 7 is fixed to the first slide portion 4a by a bolt 600, and the support shaft 15 of the first roller 5 is fixed to the spring holder 7. The support shaft 15 is fixed to the support plate 2c of the pickup nozzle housing 2. A spring holder 8 is fixed to the second slide portion 4b by a bolt 601, and a support shaft 16 of the second roller 6 is fixed to the spring holder 8. The support shaft 16 is enabled by the support plate 2c of the pickup nozzle housing 2 to move up and down within a groove 2a. Between the spring holders 7 and 8 are two springs 9, which bias and press the first, and second rollers 5, 6 against the opposite-side surface of the cam groove 106 via the spring holders 7, 8, respectively. That is, in FIG. 1, the first roller 5 is biased by the two springs 9 so as to be normally kept in contact with the lower side surface of the cam groove 106, while the second roller 6 is biased by the two springs 9 so as to be normally kept in contact with the upper side surface of the cam groove 106. Accordingly, the springs 9 have such a biasing force that the first roller 5 and the second roller 6 will be normally pressed into contact with the lower and upper side surfaces of the cam grooves 106, 107a, 107b even if the pickup nozzle moves up and down. In addition, with an arrangement that a center line 902 of the lines of force of the springs 9 is substantially coincident with a contact point 903 of the first, second rollers 5, 6 and the cam groove 106 as shown in FIG. 1, the biasing force of the springs 9 can be made to act on the rollers 5, 6 more efficiently.

Figure 5:
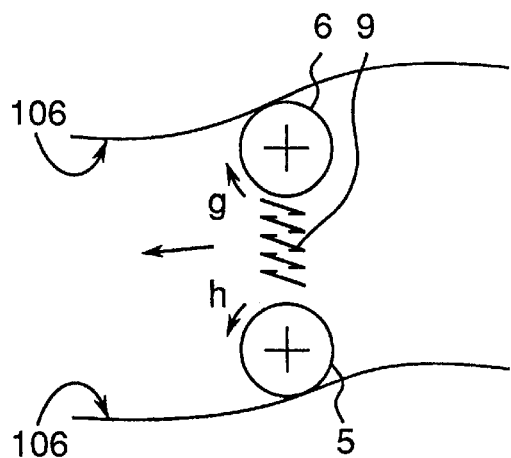
FIG. 5 is a schematic diagram showing part of the first embodiment.

With the above-described construction, as shown in FIG. 5, the first and second rollers 5, 6 will enter the fixed-portion cam groove 106 and the up/down-movable-portion cam grooves 107a, 107b and run along the directions of the arrows, thus determining the track along which the pickup nozzle unit moves.

According to the above construction, between the first and second rollers 5, 6 and the upper and lower side surfaces of the fixed-portion cam groove 106 and the up/down-movable-portion cam grooves 107a, 107b, there is no gap so that the first and second rollers 5, 6 are normally kept in contact with the upper and lower side surfaces of the cam grooves 106, 107a, 107b by the biasing force of the springs 9. Therefore, when the pickup nozzle unit changes in the moving direction between up and down, the first and second rollers 5, 6 will never collide with the upper and lower side surfaces of the cam grooves 106, 107a, 107b, so that occurrence of vibrations due to such collisions can be prevented. Also, that the precision at which the electronic component is mounted onto the circuit board can be enhanced.

Also, since the first and second rollers 5, 6 are normally kept in contact with the upper and lower side surfaces of the fixed-portion cam groove 106 and the up/down-movable-portion cam grooves 107a, 107b by the biasing force of the springs 9, the rotational direction of each of the first and second rollers 5, 6 is limited to one direction (e.g., direction h for the first roller 5 and direction g for the second roller 6 in FIG. 5). Thus, the first and second rollers 5, 6 are prolonged in service life.

Figure 6:
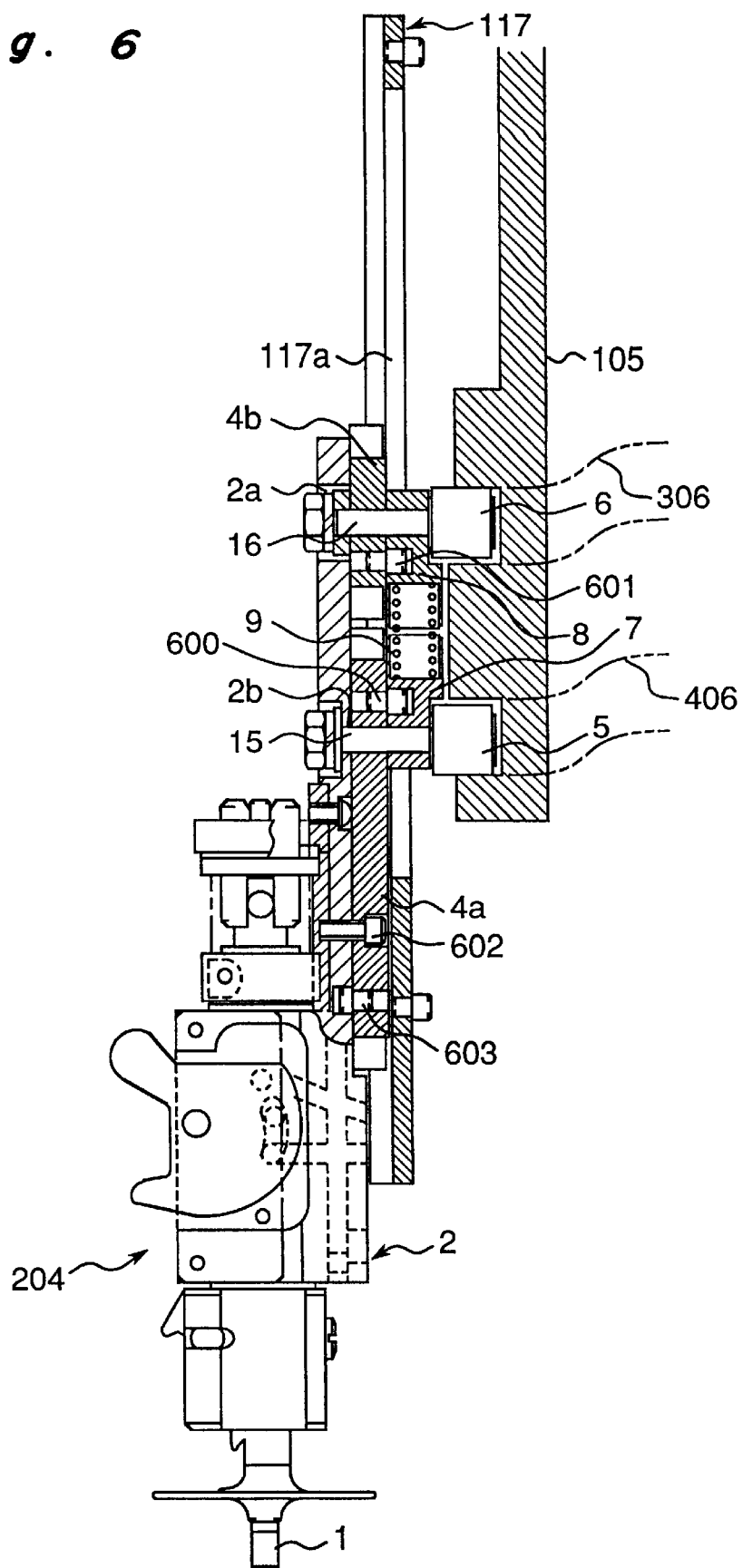
FIG. 6 is a partial side view in cross section showing part of an electronic component mounting apparatus according to a second embodiment of the present invention.
Figure 8:
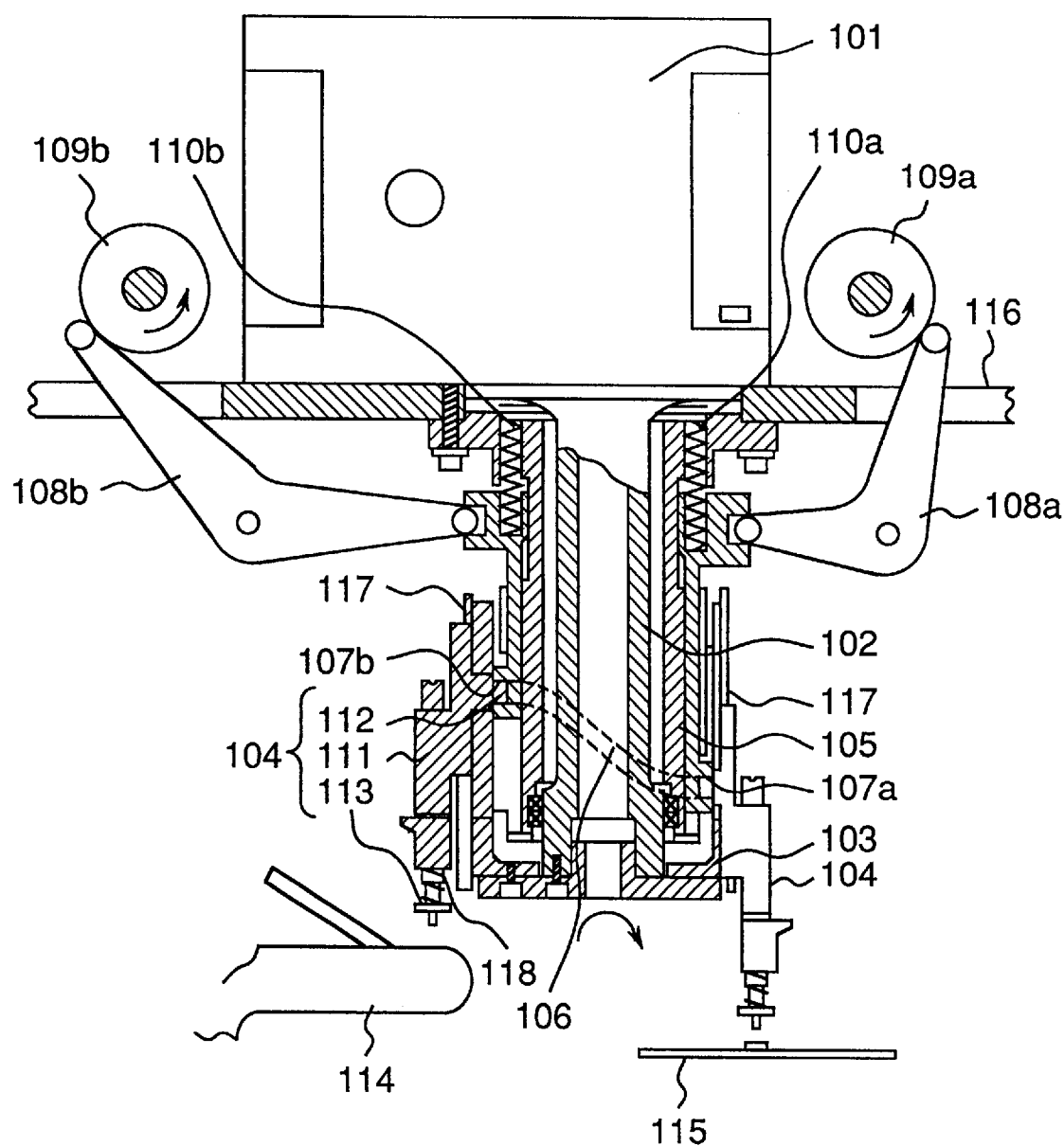
FIG. 8 is a sectional view of a prior art electronic component mounting apparatus having a cylindrical cam.
Figure 9:
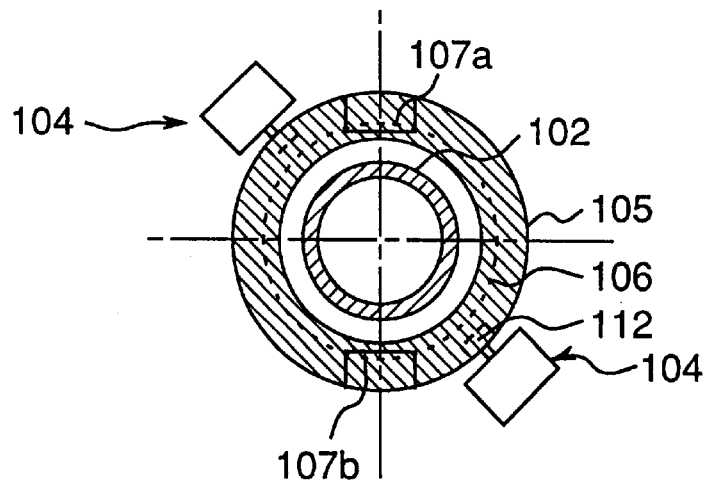
FIG. 9 is a sectional view of a prior art electronic component mounting apparatus having a cylindrical cam.
Figure 10:
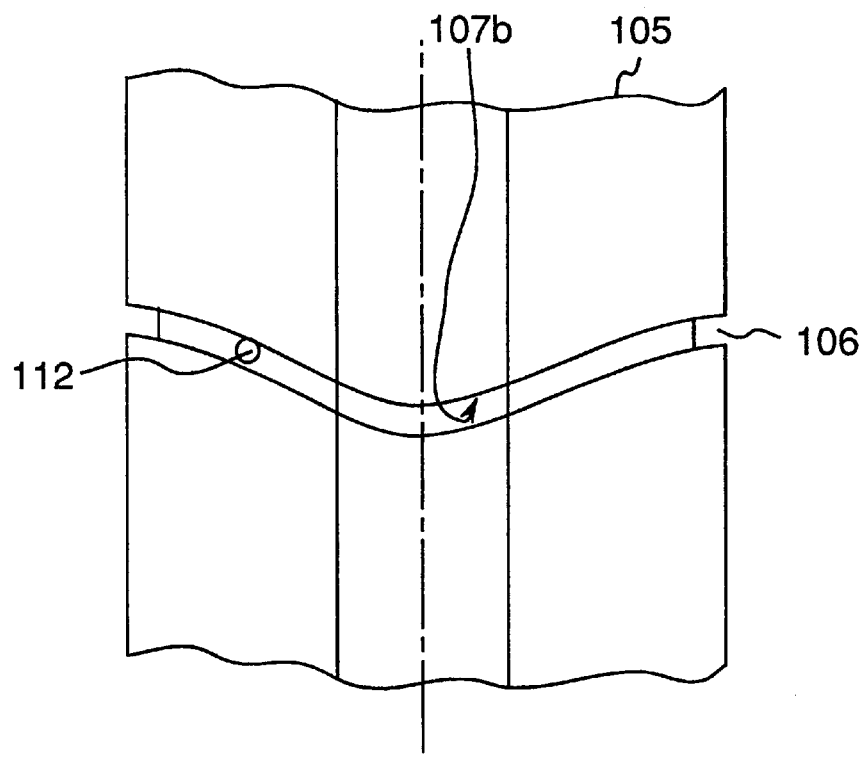
FIG. 10 is a side view showing a main part of a prior art electronic component mounting apparatus having a cylindrical cam.
Figure 11:
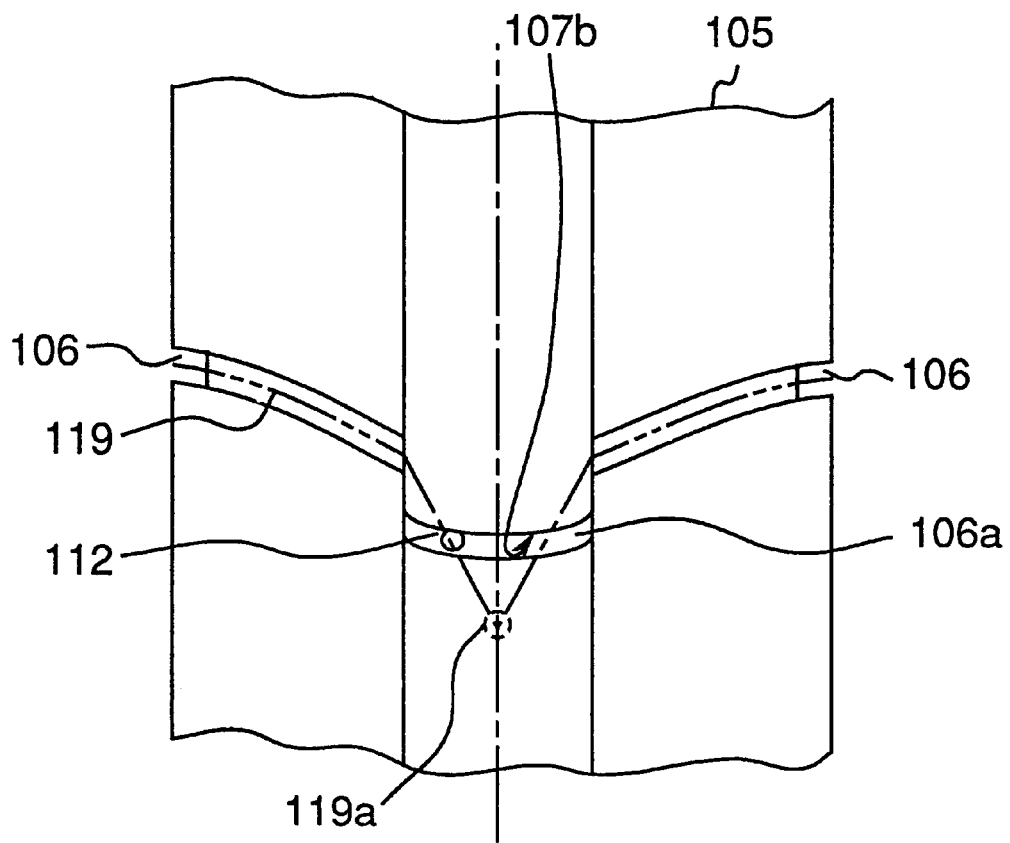
FIG. 11 is a side view showing a main part of a prior art electronic component mounting apparatus having a cylindrical cam.

Next, FIG. 6 is a partial side view in cross section showing part of an electronic component mounting apparatus according to a second embodiment of the present invention. In this second embodiment, the cam groove 106 is replaced by two cam grooves, a first cam groove 406 on the lower side and a second cam groove 306 on the upper side. A first roller 5 is fitted to the first cam groove 406 and normally pressed against the lower side surface of the first cam groove 406 by the biasing force of the spring 9, while a second roller 6 is fitted to the second cam groove 306 and normally pressed against the upper side surface of the second cam groove 306 by the biasing force of the spring 9. This is the only point in which this second embodiment differs from the first embodiment, and the rest of the construction is the same as the first embodiment. In addition, for spatial reasons, one spring 9 is provided between the spring holders 7 and 8. This second embodiment also can result in functional effects that are similar to those of the first embodiment.

FIGS. 7A and 7B are a partial side view in cross section and a plan view, respectively, showing part of an electronic component mounting apparatus according to a third embodiment of the present invention. In this third embodiment, one roller 5 is used in place of the two rollers 5, 6, and this first roller 5 is normally kept in press contact with either the upper or lower side surface, for example the lower side surface in FIG. 7A, of the cam groove 206 by the biasing force of the spring 9. A slide portion 204a is fixed to the pickup nozzle unit 2c by bolts 602 and 603 as in the first embodiment. A support shaft 210 of the first roller 5 is fixed to the pickup nozzle unit 2c and the slide portion 204a. The slide portion 204a is slidable up and down against a fixed up/down guide 217 by the guide of a pair of ball guides 400 which are similar to those of the first embodiment, and the support shaft 210 of the first roller 5 is movable up and down within a guide groove 217a of the up/down guide 217. An upper end of the up/down guide 217 is bent into an L shape, and a compression spring 209 is provided between the end and an upper portion of the slide portion 204a so that the slide portion 2c is normally biased downward against the up/down guide 207. Accordingly, the first roller 5 is normally biased downward via the slide portion 204a and the support shaft 210 by the biasing force of the spring 209 so that the first roller 5 is pressed and biased against the lower side surface of the cam groove 206. The spring 209 has such a biasing force that the first roller 5 will maintain normally in press contact with the lower side surface of the cam groove 206 even if the pickup nozzle 1 moves up and down.

This third embodiment also can result in functional effects similar to those of the first embodiment.

In the foregoing first and second embodiments, the first slide portion 4a is fixed to the support plate 2c, while the second slide portion 4b is movable up and down against the support plate 2c. However, without the limitation to such an arrangement, it may also be arranged that, conversely, the second slide portion 4b is fixed to the support plate 2c while the first slide portion 4a is movable up and down against the support plate 2c. Moreover, both the first slide portion 4a and the second slide portion 4b may be movable up and down.

The present invention, without being limited to those in which the pickup nozzle moves up and down integrally with the pickup nozzle unit, may be applied to those in which the pickup nozzle alone moves up and down.

Although the present invention has been fully described in conjunction with preferred embodiments thereof with reference to the accompanying drawings, various changes and modifications will be apparent to those skilled in the art. Therefore, unless otherwise such changes and modifications depart from the scope of the present invention as defined by the appended claims, they should be construed as included therein.

What is claimed is:

1. An electronic component mounting apparatus comprising:
   a rotary table capable of being intermittently driven about a central axis;
   a plurality of pickup nozzles disposed along a periphery of the rotary table so as to be movable up and down;

a cylindrical cam disposed inside of the rotary table and positioned so as to be coaxial with said rotary table, said cylindrical cam having a cam groove formed in on outer peripheral surface of the cylindrical cam for effecting up and down movement of the pickup nozzles in response to intermittent rotation of the rotary table;

a first roller attached to one of the pickup nozzles and disposed within the cam groove;

a second roller attached to the one pickup nozzle and disposed within the cam groove, wherein movement of the first and second rollers along the cam groove causes the one pickup nozzle to move up and down; and a spring assembly for biasing the first and second rollers into contact with first and second side surfaces of the cam groove, respectively.

2. The electronic component mounting apparatus as claimed in claim 1, wherein the spring assembly is arranged so that a center line of the lines of force of the spring assembly is substantially coincident with contact points of the first and second rollers with the first and second surfaces of the cam groove, respectively.

3. The electronic component mounting apparatus as claimed in claim 1, wherein at least one of the first and second rollers is mounted so as to be movable in a biasing direction of the spring assembly.

4. The electronic component mounting apparatus as claimed in claim 1, wherein the first side surface of the cam groove is a lowermost groove surface, and the second side surface of the cam groove is an uppermost groove surface.

5. The electronic component mounting apparatus as claimed in claim 1, wherein the spring assembly comprises a pair of compression springs.

6. The electronic component mounting apparatus as claimed in claim 1, wherein said first roller is arranged below said second roller.

7. The electronic component mounting apparatus as claimed in claim 1, wherein said spring assembly includes at least one compression spring that biases said first and second rollers in opposite directions.

8. An electronic component mounting apparatus comprising:

a rotary table capable of being intermittently driven about a central axis;

a plurality of pickup nozzles disposed along a periphery of the rotary table so as to be movable up and down;

a cylindrical cam disposed inside of the rotary table and positioned so as to be coaxial with said rotary table, said cylindrical cam having an upper cam groove and a lower cam groove formed in an outer peripheral surface of the cylindrical cam for effecting up and down movement of the pickup nozzles in response to intermittent rotation of the rotary table;

a first roller attached to one of the pickup nozzles and disposed within the lower cam groove;

a second roller attached to the one pickup nozzle and disposed within the upper cam groove; and a spring for biasing the first roller into contact with a lower side surface of the lower cam groove, and for biasing the second roller into contact with an upper side surface of the upper cam groove.

9. The electronic component mounting apparatus as claimed in claim 8, wherein at least one of the first and second rollers is mounted so as to be movable in a biasing direction of the spring.

10. The electronic component mounting apparatus as claimed in claim 8, wherein said first roller is arranged below said second roller.

11. The electronic component mounting apparatus as claimed in claim 8, wherein said spring assembly includes at least one compression spring that biases said first and second rollers in opposite directions.

12. An electronic component mounting apparatus comprising:

a rotary table capable of being intermittently driven about a central axis;

a plurality of pickup nozzles units disposed along a periphery of the rotary table so as to be movable up and down; and a cylindrical cam disposed inside of said rotary table and positioned so as to be coaxial with said rotary table, said cylindrical cam having a cam groove formed in an outer peripheral surface of the cylindrical cam for effecting up and down movement of the pickup nozzle units in response to intermittent rotation of the rotary table, wherein each of said plurality of pickup nozzle units comprises:

a first roller disposed within said cam groove;

a second roller disposed within the cam groove, wherein movement of the first and second rollers along the cam groove causes the respective pickup nozzle unit to move up and down; and a spring assembly for biasing the first and second rollers into contact with first and second side surfaces of the cam groove, respectively.

13. The electronic component mounting apparatus as claimed in claim 12, wherein, in each of said pickup nozzle units, said first roller is arranged below said second roller.

14. The electronic component mounting apparatus as claimed in claim 12, wherein said spring assembly includes at least one coil compression spring that biases said first and second rollers in opposite directions.

* * * * *